United States Patent [19]

Simpson et al.

[11] Patent Number: 5,502,401
[45] Date of Patent: Mar. 26, 1996

[54] CONTROLLABLE WIDTH OR GATE

[75] Inventors: Richard Simpson, Carlton, Great Britain; Erick Oakland, Zavalla, Tex.

[73] Assignee: Texas Instruments Incorporated, Dallas, Tex.

[21] Appl. No.: 428,978

[22] Filed: Apr. 26, 1995

[51] Int. Cl.$^6$ .................................................. H03K 19/173
[52] U.S. Cl. ........................... 326/38; 326/44; 326/49; 326/113
[58] Field of Search ............................. 326/37–39, 49–50, 326/112–113, 119, 44–45

[56] References Cited

U.S. PATENT DOCUMENTS

| 3,912,914 | 10/1975 | Moylan | 326/38 |
| 5,012,135 | 4/1991 | Kaplinsky | 326/38 |
| 5,138,198 | 8/1992 | Shen et al. | 326/38 |

*Primary Examiner*—Edward P. Westin
*Assistant Examiner*—Jon Santamauro
*Attorney, Agent, or Firm*—Robert D. Marshall, Jr.; James C. Kesterson; Richard L. Donaldson

[57] ABSTRACT

A controllable width OR gate employs a plurality of controllable OR gate cells. If the maximum width of the data to be ORed is N bits, then N-1 such controllable OR gate cells are needed. Each controllable OR gate cell 100 has four data inputs, OR0, ST0, OR1 and ST1, and a single control input C0. Each controllable OR gate cell has two outputs: ORout and STout. A first OR gate forms the OR of the OR0 and OR1 inputs unconditionally as the ORout output. A second OR gate forms the OR of the OR0 input and the ST1 input. Two pass gates are controlled in the opposite sense via the signal on control input C0 due to an invertor. If C0 is "1", then the output the second OR gate (OR0 OR ST1) is supplied to output STout. If C0 is "0", the ST0 input is supplied to output STout. Layers of the controllable OR gate cell can be used to from a wide controllable width OR gate. Each layer of cells is controlled by a corresponding bit of the control word. The STout of a single cell of a final layer forms the controllable width OR gate output.

3 Claims, 5 Drawing Sheets

CONTROLLABLE WIDTH OR GATE

TECHNICAL FIELD OF THE INVENTION

The technical field of this invention is the field of digital data processing and more particularly microprocessor circuits, architectures and methods for digital data processing especially floating point arithmetic.

BACKGROUND OF THE INVENTION

Floating point arithmetic often requires alignment of the binary point of two numbers before operation. The exponent of the two numbers is compared to determine how much of a shift is needed to align the binary points. The mantissa of the smallest number is right shifted a number of places equal to the difference between the exponent of the greatest number and the exponent of the smallest number. This shift aligns the binary points of the number and permits addition or subtraction. The shift also loses some of the least significant bits of the smallest number, which are shifted out.

Following the arithmetic operation the result is rounded. The IEEE-754 floating point specification defines four rounding modes: 1) round towards positive infinity; 2) round towards negative infinity; 3) round towards the nearest integer; and round toward zero, also known as truncation. In the first three of these modes, the rounding may depend upon whether any of the shifted out least significant bits of the smallest number were 1. This is known as the sticky bit. It is known in the art to view these bits as they are shifted out during the shift operation. This permits detection of whether one or more of these bits is 1. This technique is relatively disadvantageous because it requires the complete shift to take place before the sticky bit is known. It would be advantageous if there were a faster method for determining if one or more of these shifted out least significant bits were 1.

SUMMARY OF THE INVENTION

This invention forms a controllable width OR gate. Such a controllable width OR gate function is useful in floating point arithmetic. The controllable width OR gate employs a plurality of controllable OR gate cells. If the maximum width of the data to be ORed is N bits, then N-1 such controllable OR gate cells are needed.

Each controllable OR gate cell 100 has four data inputs, OR0, ST0, OR1 and ST1, and a single control input C0. Each controllable OR gate cell has two outputs: ORout and STout. A first OR gate forms the OR of the OR0 and OR1 inputs unconditionally as the ORout output. A second OR gate forms the OR of the OR0 input and the ST1 input. Two pass gates are controlled in the opposite sense via the signal on control input C0 due to an invertor. If C0 is "1", then the output the second OR gate (OR0 OR ST1) is supplied to output STout. If C0 is "0", the ST0 input is supplied to output STout. Thus controllable OR gate cell 100 produces the following functions:

ORout=OR0 OR OR1

STout=[(ST1 OR OR0) AND C0] OR [ST0 AND NOT(C0)]

The controllable OR gate cell can be used to from a wide controllable width OR gate. For a first layer, a first data input supplies both the OR0 and the ST0 inputs and a second data input supplies both the OR1 and the ST1 inputs. The least significant bit of the control word supplies the C0 inputs. Subsequent layers of controllable OR gate cells have their OR0 input connected to the ORout output of a first cell of a prior layer, their ST0 input connected to the STout output of this first cell of the prior layer, their OR1 input connected to the ORout output of a second cell of the prior layer, and their ST1 input connected to the STout output of the second cell of the prior layer. Each layer of cells is controlled by a corresponding bit of the control word. The STout of a single cell of a final layer forms the controllable width OR gate output.

BRIEF DESCRIPTION OF THE FIGURES

These and other aspects of the present invention are described below together with the Figures, in which.

DETAILED DESCRIPTION OF PREFERRED EMBODIMENTS

This invention is a controllable width OR gate. This provides a fast way to program an OR gate from 1 to N bits wide. This function can be useful in floating point arithmetic logic units.

The controllable width OR gate has two inputs. The first input is a data bus of the data to be ORed. The second input is a control word input used to determine the width of the OR gate. There are two outputs from the controllable width OR gate. The first output is single bit output ORout, which is the OR of all the bits of the data bus regardless of the control word input. The second output is a single bit output STout, which is the OR of all the bits of the data bus from bit 0 to the bit specified by the control word. The controllable width OR gate is formed of repeated cells. Each of these cells includes the data and control word inputs and forms the ORout and STout outputs. The ORout signal from the repeated cells is used as an intermediate signal.

Figure 1:
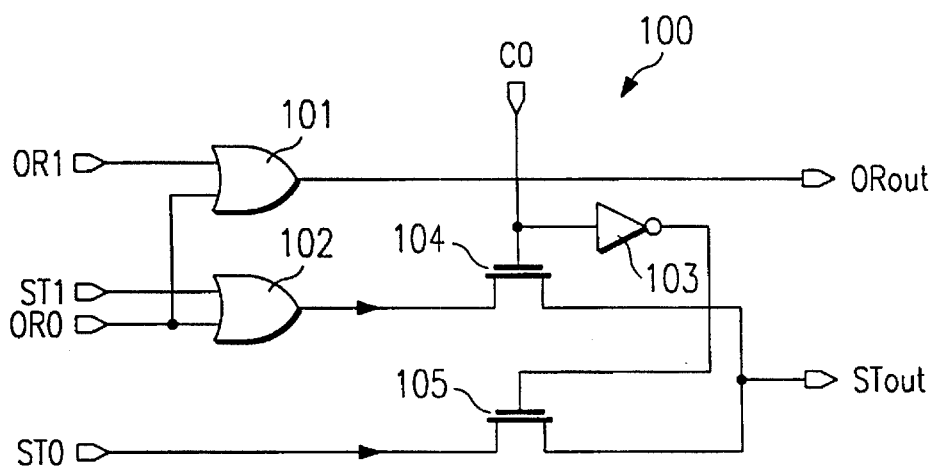
FIG. 1 illustrates the circuits in a two bit controllable OR gate cell employed in this invention.

FIG. 1 illustrates a controllable OR gate cell 100 used as a basic building block. The controllable OR gate cell 100 has four data inputs, OR0, ST0, OR1 and ST1, and a single control input C0. The controllable OR gate cell has two outputs: ORout and STout. The OR gate 101 forms the OR of the OR0 and OR1 inputs unconditionally. The OR gate 101 supplies the ORout output. The OR gate 102 forms the OR of the OR0 input and the ST1 input. Two pass gates 104 and 105 are controlled in the opposite sense via the signal on control input C0 due to invertor 103. If C0 is "1", then the output of OR gate 102 is supplied to output STout. If C0 is "0", the ST0 input is supplied to output STout. The signal STout is a wired OR function. Due to the action of invertor 103 and pass gates 104 and 105, only a single input to this wired OR is active at any time. Thus controllable OR gate cell 100 produces the following functions:

ORout=OR0 OR OR1

STout=[(ST1 OR OR0) AND C0] OR [ST0 AND NOT(C0)]

The controllable OR gate cell 100 can be used to form a wide controllable width OR gate. In this use, a first input D0 supplies both the OR0 and the ST0 inputs and a second input D1 supplies both the OR1 and the ST1 inputs. The ORout signal is D0 OR D1 regardless of the state of the control signal C0. If C0="0", then the STout signal is D0, essentially a 1 bit OR gate of D0. If C0="1", the STout is D0 OR D1.

Figure 2:
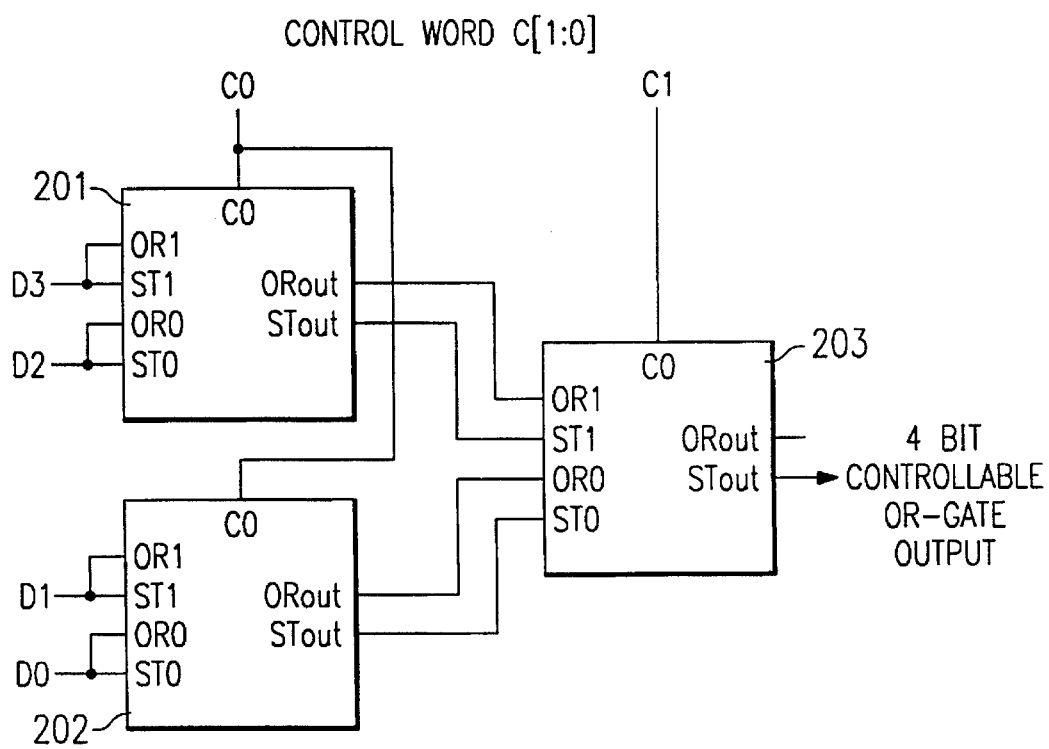
FIG. 2 illustrates the construction of a 4 bit wide controllable width OR gate employing 3 controllable OR gate cells as illustrated in FIG. 1.

FIG. 2 illustrates a 4 bit wide variable width OR gate employing three controllable OR gates cells. Controllable OR cells 210, 202 and 203 are constructed as illustrated in FIG. 1. Data input D0 supplies both the OR0 and the ST0 inputs of controllable OR gate cell 201. Data input D1 supplies both the OR1 and the ST1 inputs of controllable OR gate cell 201. Data input D2 supplies both the OR0 and the ST0 inputs of controllable OR gate cell 202. Data input D3 supplies both the OR1 and the ST1 inputs of controllable OR gate cell 202. The control word bit C0 supplies the C0 inputs of both controllable OR gate cells 201 and 202. The STout output of controllable OR gate cell 201 supplies the ST0 input of controllable OR gate cell 203. The ORout output of controllable OR gate cell 201 supplies the OR0 input of controllable OR gate cell 203. The STout output of controllable OR gate cell 202 supplies the ST1 input of controllable OR gate cell 203. The ORout output of controllable OR gate cell 202 supplies the OR1 input of controllable OR gate cell 203. The control word bit C1 supplies the C0 input of controllable OR gate cells 203. The STout output of controllable OR gate cell 203 produces the desired controllable width OR gate output.

The four bit wide controllable width OR gate illustrated in FIG. 2 operates as follows. The control word C(1:0) is set to indicate the desired OR gate width. This is shown in Table 1 below:

TABLE 1

| Control Word | | OR Gate |
|---|---|---|
| C1 | C0 | Width |
| 0 | 0 | 1 |
| 0 | 1 | 2 |
| 1 | 0 | 3 |
| 1 | 1 | 4 |

For C(1:0)=(0,0) controllable OR gate cell 203 couples only its ST0 input to the OR gate output. Controllable OR gate cell 202 supplies the ST0 input of controllable OR gate cell 203 with its ST0 input, which is the D0 input. Thus the controllable OR gate output is D0. For C(1:0)=(0,1) controllable OR gate cell 203 couples only its ST0 input to the OR gate output. Controllable OR gate cell 202 supplies the ST0 input of controllable OR gate cell 203 with an OR of its ST1 input and its OR0 input. This is D0 OR D1. Thus the controllable OR gate output is D0 OR D1. For C(1:0)=(1,0) controllable OR gate cell 203 couples an OR of its ST1 input and its OR0 input the OR gate output. The ST1 input of controllable OR gate cell 203 is the STout of controllable OR gate cell 201. Because C0=0, this is the D2 input. The OR0 input of controllable OR gate cell 203 is the ORout of controllable OR gate cell 202, which is D0 OR D1. Thus the controllable OR gate output is D0 OR D1 OR D2. For C(1:0)=(1,1) controllable OR gate cell 203 couples an OR of its ST1 input and its OR0 input the OR gate output. The ST1 input of controllable OR gate cell 203 is the STout of controllable OR gate cell 201. Because C0=1, this is D2 OR D3. The OR0 input of controllable OR gate cell 203 is the ORout of controllable OR gate cell 202, which is D0 OR D1. Thus the controllable OR gate output is D0 OR D1 OR D2 OR D3. It can be seen that the structure of FIG. 2 produces an OR of a number of data lines corresponding to the control word. In particular, the number of data lines of the controllable width OR gate is one more than the value of the control word.

Larger controllable width OR gates are formed using a plurality of controllable OR gates cell 100. As detailed above, a 4 bit wide variable width OR gate is the OR of two wide variable width OR gates. An 8 bit wide variable width OR gate is the OR of two 4 bit wide variable width OR gates, etc. FIG. 2 illustrates the connections of a 32 bit wide variable width OR gate.

Figure 3A:
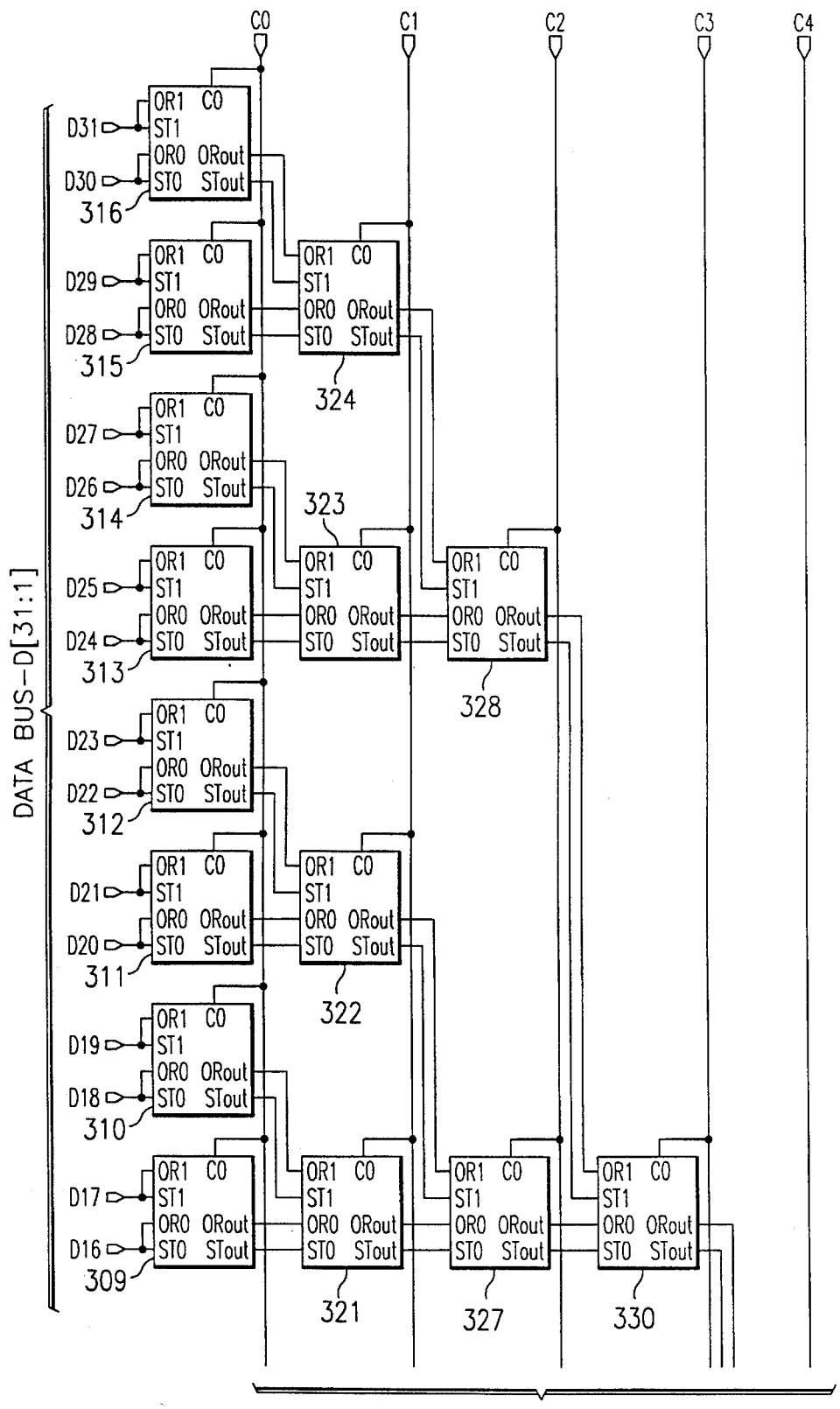
FIG. 3 illustrates the construction of a 32 bit wide controllable width OR gate employing 31 controllable OR gate cells as illustrated in FIG. 1.
Figure 3B:
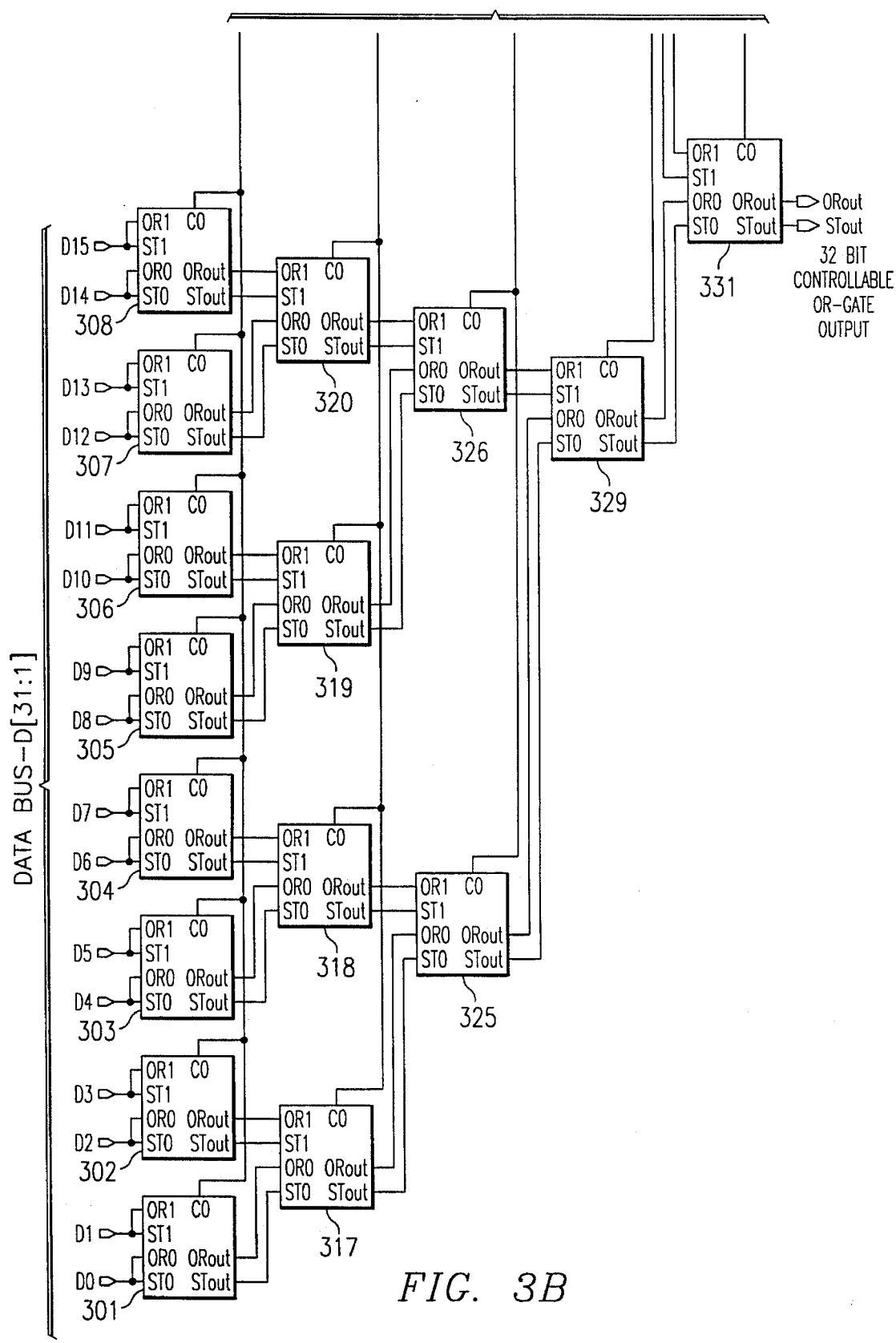

A 32 bit wide variable width OR gate requires 5 control signals C(4:0). As shown in FIG. 3, this 32 bit wide OR gate is formed of two 16 bit wide OR gates. If the most significant control bit C4 is "0", then the maximum position up to which it is required to perform the OR is in the lower half of the data bus bits 0 to 15. Therefore the resultant OR from STout is the OR from the least significant 16 bits of the data bus. Which of these bits is controlled by the signals C(3:0). If the most significant control bit C4 is "1", then the maximum position up to which it is required to perform the OR is within the upper half of the data bus bits 16 to 31. The resultant OR from STout is all the bits of the least significant half of the data bus D(15:0) ORed with the appropriate number of bits of the upper half of the data bus. This number is controlled by the four least significant bits of the control word C(3:0). Thus a 32 bit controllable width OR gate is a combination of two 16 bit controllable width OR gates. Similar reasoning applies to a 16 bit controllable width OR gate, a 4 bit controllable width OR gate down to the two bit controllable width OR gate cell 100 of FIG. 1.

FIG. 3 illustrates a 32 bit wide controllable width OR gate constructed according to these principles. Controllable OR gate cells 301 to 316 directly receive the 32 bits of data D(31:0). Each of these controllable OR gate cells 301 to 316 receives two adjacent bits of the input data. As shown in FIG. 3, each data input line drives a ST input and an OR input of the controllable OR gate cell. Controllable OR gate cells 301 to 316 are controlled via the C0 bit of the control word C(4:0). Controllable OR gate cells 301 to 316 supply signals to controllable OR gate cells 317 to 324. The ST0 and OR0 inputs of these controllable OR gate cells 317 to 324 receive an output STout from a first of the controllable OR gate cells 301 to 316 at its ST0 input and an output ORout from this controllable OR gate cell at its OR0 input. A second of the controllable OR gate cells 301 to 316 supplies the ST1 and OR1 inputs from its STout output and its ORout, respectively. Controllable OR gate cells 317 to 324 are controlled via the C1 bit of the control word C(4:0). In a similar fashion, controllable OR gate cells 325 to 328 receive inputs from the outputs of controllable OR gate cells 317 to 324 and are controlled by the C2 bit of the control word C(4:0). Controllable OR gate cells 329 and 330 receive similar inputs from controllable OR gate cells 325 to 328 and are controlled by the C3 bit of the control word C(4:0). Lastly, controllable OR gate cell 331 receives inputs from controllable OR gate cells 329 and 330 and is controlled by the C4 bit of the control word C(4:0). Controllable OR gate cell 331 supplies the 32 bit controllable width OR gate output at its STout output.

Table 2 shows the relationship between the control word C(4:0), the 32 bits of the date bus D(31:0) and the two outputs Stout and ORout of controllable OR gate cell 331.

TABLE 2

| C4 | C3 | C2 | C1 | C0 | STout | ORout |
|---|---|---|---|---|---|---|
| 0 | 0 | 0 | 0 | 0 | D[0] | OR of D[31:0] |
| 0 | 0 | 0 | 0 | 1 | OR of D[1:0] | OR of D[31:0] |
| 0 | 0 | 0 | 1 | 0 | OR of D[2:0] | OR of D[31:0] |
| 0 | 0 | 0 | 1 | 1 | OR of D[3:0] | OR of D[31:0] |
| 0 | 0 | 1 | 0 | 0 | OR of D[4:0] | OR of D[31:0] |
| 0 | 0 | 1 | 0 | 1 | OR of D[5:0] | OR of D[31:0] |
| 0 | 0 | 1 | 1 | 0 | OR of D[6:0] | OR of D[31:0] |
| 0 | 0 | 1 | 1 | 1 | OR of D[7:0] | OR of D[31:0] |
| 0 | 1 | 0 | 0 | 0 | OR of D[8:0] | OR of D[31:0] |
| 0 | 1 | 0 | 0 | 1 | OR of D[9:0] | OR of D[31:0] |
| 0 | 1 | 0 | 1 | 0 | OR of D[10:0] | OR of D[31:0] |
| 0 | 1 | 0 | 1 | 1 | OR of D[11:0] | OR of D[31:0] |
| 0 | 1 | 1 | 0 | 0 | OR of D[12:0] | OR of D[31:0] |
| 0 | 1 | 1 | 0 | 1 | OR of D[13:0] | OR of D[31:0] |
| 0 | 1 | 1 | 1 | 0 | OR of D[14:0] | OR of D[31:0] |
| 0 | 1 | 1 | 1 | 1 | OR of D[15:0] | OR of D[31:0] |
| 1 | 0 | 0 | 0 | 0 | OR of D[16:0] | OR of D[31:0] |
| 1 | 0 | 0 | 0 | 1 | OR of D[17:0] | OR of D[31:0] |
| 1 | 0 | 0 | 1 | 0 | OR of D[18:0] | OR of D[31:0] |
| 1 | 0 | 0 | 1 | 1 | OR of D[19:0] | OR of D[31:0] |
| 1 | 0 | 1 | 0 | 0 | OR of D[20:0] | OR of D[31:0] |
| 1 | 0 | 1 | 0 | 1 | OR of D[21:0] | OR of D[31:0] |
| 1 | 0 | 1 | 1 | 0 | OR of D[22:0] | OR of D[31:0] |
| 1 | 0 | 1 | 1 | 1 | OR of D[23:0] | OR of D[31:0] |
| 1 | 1 | 0 | 0 | 0 | OR of D[24:0] | OR of D[31:0] |
| 1 | 1 | 0 | 0 | 1 | OR of D[25:0] | OR of D[31:0] |
| 1 | 1 | 0 | 1 | 0 | OR of D[26:0] | OR of D[31:0] |
| 1 | 1 | 0 | 1 | 1 | OR of D[27:0] | OR of D[31:0] |
| 1 | 1 | 1 | 0 | 0 | OR of D[28:0] | OR of D[31:0] |
| 1 | 1 | 1 | 0 | 1 | OR of D[29:0] | OR of D[31:0] |
| 1 | 1 | 1 | 1 | 0 | OR of D[30:0] | OR of D[31:0] |
| 1 | 1 | 1 | 1 | 1 | OR of D[31:0] | OR of D[31:0] |

Figure 4:
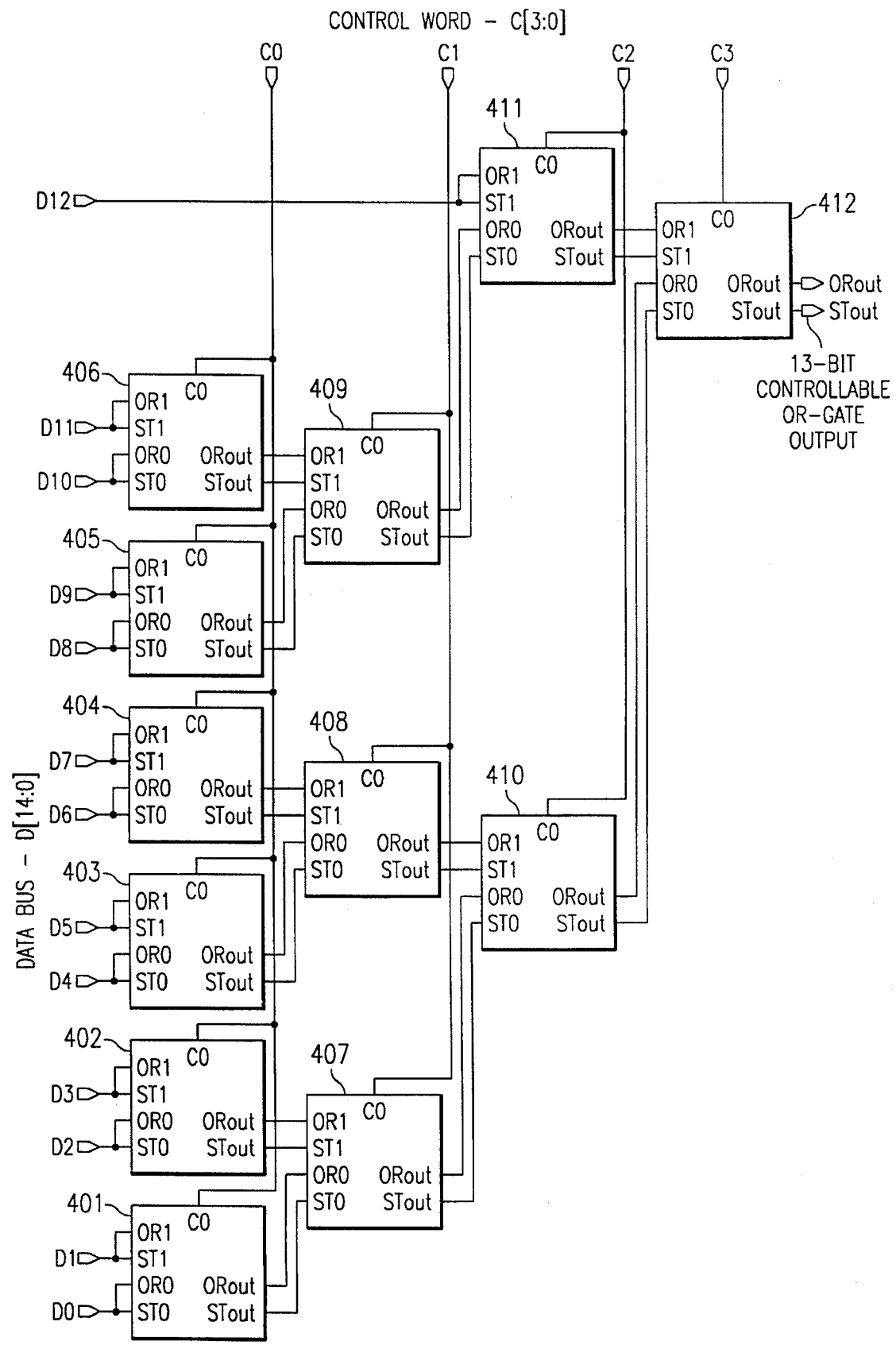
FIG. 4 illustrates the construction of a 13 bit wide controllable width OR gate employing 12 controllable OR gate cells as illustrated in FIG. 1.

FIG. 4 illustrates how controllable OR gate cells 401 to 412 are connected to construct a 13 bit controllable width OR gate. Controllable OR gate cells 401 to 412 are connected in a fashion similar to that shown in FIG. 3. FIG. 4 shows that this technique can be used to form a controllable width OR gate having a size that is not an integral power of 2. Table 3 shows the relationship between the control word C(3:0), the 13 bits of the date bus D(13:0) and the two outputs Stout and ORout of controllable OR gate cell 412.

TABLE 3

| C3 | C2 | C1 | C0 | STout | ORout |
|---|---|---|---|---|---|
| 0 | 0 | 0 | 0 | D[0] | OR of D[12:0] |
| 0 | 0 | 0 | 1 | OR of D[1:0] | OR of D[12:0] |
| 0 | 0 | 1 | 0 | OR of D[2:0] | OR of D[12:0] |
| 0 | 0 | 1 | 1 | OR of D[3:0] | OR of D[12:0] |
| 0 | 1 | 0 | 0 | OR of D[4:0] | OR of D[12:0] |
| 0 | 1 | 0 | 1 | OR of D[5:0] | OR of D[12:0] |
| 0 | 1 | 1 | 0 | OR of D[6:0] | OR of D[12:0] |
| 0 | 1 | 1 | 1 | OR of D[7:0] | OR of D[12:0] |
| 1 | 0 | 0 | 0 | OR of D[8:0] | OR of D[12:0] |
| 1 | 0 | 0 | 1 | OR of D[9:0] | OR of D[12:0] |
| 1 | 0 | 1 | 0 | OR of D[10:0] | OR of D[12:0] |
| 1 | 0 | 1 | 1 | OR of D[11:0] | OR of D[12:0] |
| 1 | 1 | 0 | 0 | OR of D[12:0] | OR of D[12:0] |
| 1 | 1 | 0 | 1 | OR of D[12:0] | OR of D[12:0] |
| 1 | 1 | 1 | 0 | OR of D[12:0] | OR of D[12:0] |
| 1 | 1 | 1 | 1 | OR of D[12:0] | OR of D[12:0] |

Note that the otherwise undefined encodings of control word C(3:0) of (1,1,0,1), (1,1,1,0) and (1,1,1,1), corresponding to OR gate widths of 14, 15 and 16 bits, are defined as the total input width of 13 bits. The data input D12 is supplied to both the OR1 and ST1 inputs of controllable OR gate cell 411. This input effectively skips over other controllable OR gate cells which would have been used in a 16 bit wide controllable width OR gate. Using this skipping technique it is possible to construct controllable width OR gates of any size. An N bit wide controllable width OR gate required N-1 controllable OR gate cells such as illustrated in FIG. 1.

Figure 5:
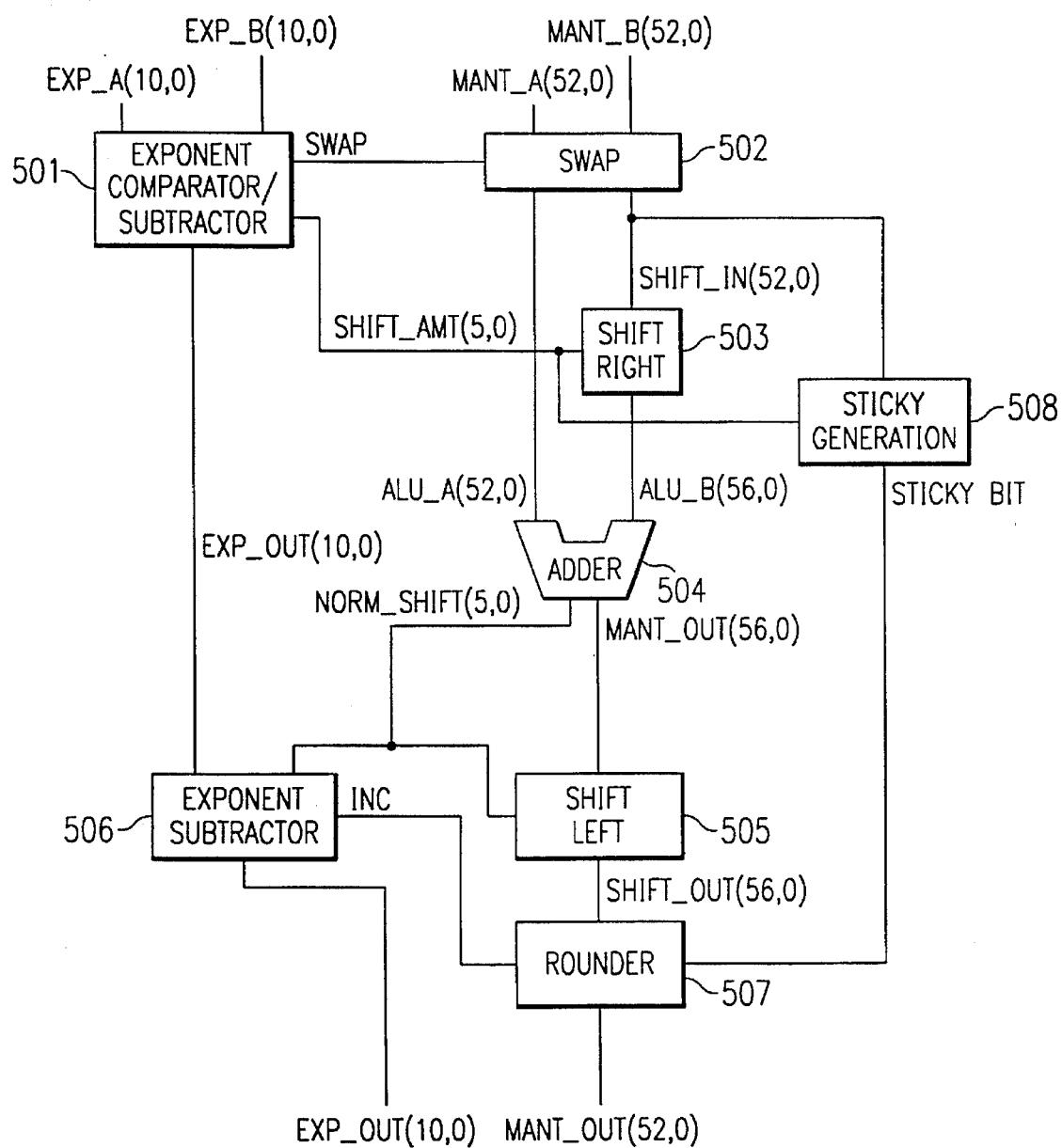
FIG. 5 illustrates the architecture of a floating point arithmetic logic unit employing the controllable width sticky generator of this invention.

Construction of a floating point adder unit employing the controllable width OR gate of this invention as a sticky generator is illustrated in FIG. 5. This means a double precision operation can be started on every cycle and has the same latency as single precision. The floating point adder unit has the following stages. Exponent comparator/subtractor 501 compares exponents and shift smaller number right to align binary point. Swap unit 502 optionally swaps the first and second operands before supply to adder 504. Shift right unit 503 receives a signal from exponent comparator/subtractor 501 and makes a corresponding right shift in the second operand. Note that swap unit 502 insures that alignment can be achieved by a right shift. The first step in adding or subtracting two binary numbers is to align the mantissa binary points. If exponent comparator/subtractor 501 determines the first operand has the smaller exponent, the two operands are swapped in swap unit 502. The net amount of right shift in the optionally swapped second operand, which now has the smaller exponent, right is the absolute difference between the exponents of the first and second operands. The two operands are then fed into standard full adder 504. Full adder 504 predicts the location of the leading 1 in the mantissa which is used in the normalize step.

The IEEE standard 754 requires that all operations be done as if using infinite precision and then rounding to the destination format. To conform to the IEEE standard 754 the shift right unit 503 adds 3 bits to the least significant end of the mantissa. The first two are normal extra bits of precision. The third bit is the logical OR of all the bits shifted off the end of the mantissa during the right shift of the smallest input number.

After completion of the add/subtract the mantissa is now 3 bits longer than when it started and the hidden bit may not be a "1". This can happen if the two mantissas were subtracted, or the addition of two numbers with opposite signs. The definition of a normalized number requires the hidden bit to be a "1". The floating point adder unit normalizes the mantissa. Shift left unit 505 left shifts the mantissa until the hidden bit is a "1". The number of shifts required to normalize the mantissa is generated by full adder 504. If the mantissa is shifted left, then exponent subtractor 506 decrements the exponent reflect the new mantissa by subtracting the shift count from the exponent. This is satisfactory if the exponent does not go below the minimum exponent value, which is a biased value of 1. If the exponent does go below it's minimum value, the number becomes denormalized. The left shift is only allowed until the exponent is 1 or the shift has completed. The number coming out of the shift left unit 505 has now been normalized as much as possible and is ready to be rounded into the destination precision.

The rounder 507 uses the three extended bits of precision along with the sticky bit, sign, and the rounding mode. The rounding modes are defined by the IEEE standard 754 standard and are selected by the user. The four rounding modes are 1) round towards positive infinity; 2) round towards negative infinity; 3) round towards the nearest integer; and round toward zero, also known as truncation. The round to nearest integer (half adjust) and the round to zero (truncate) are the most common rounding modes. The directed rounding modes are normally used to control round off error in a known manner. The round to zero mode is simple; the input mantissa is truncated to the destination precision. The round to nearest mode can be stated as being round to nearest, or to even if exactly halfway. In the round to nearest mode, the mantissa is incremented if the following equation is true:

round_up=1st-bit AND (2nd-bit OR 3rd-bit OR sticky)

Sticky generator 508 supplies the sticky bit to rounder 507. Sticky generator 508 receives the shift amount from exponent comparator/subtractor 501 and the smaller mantissa from swap unit 502. Sticky generator 508 consists of a controllable width OR gate of the type described above. The size of the controllable width depends upon the precision selected for the floating point adder. The IEEE-744 floating point standard defines single precision as having a mantissa fractional part of 22 bits. Since the right shift may shift out the hidden bit also, the sticky generator for single precision arithmetic should have 23 bits. The IEEE-744 floating point standard defines double precision as having a mantissa fractional part of 52 bits. Thus the sticky generator for double precision arithmetic should have 53 bits. The floating point unit illustrated in FIG. 5 operates upon double precision floating point numbers, note that shift amount has six bits capable of specifying a shift larger than a double precision mantissa.

The least significant bits of the mantissa received from swap unit 502 serves as the least significant bits of the data supplied to the controllable width OR unit. One less than the shift amount serves as the control word for the controllable width OR unit. The resultant OR is the sticky bit, which is supplied to rounder 507 for use in the rounding process.

What is claimed is:

1. An N bit wide controllable width OR gate comprising:

an N bit wide data input port;

a control word input port receiving a control word of M bits, where M equals $\log_2 N$ rounded up to the nearest integer number of bits;

N-1 controllable OR gate cells, each controllable OR gate cell having an OR0 input, a ST0 input, an OR1 input, a ST1 input, a control bit input, an ORout output and a STout output, each controllable OR gate cell having a first OR gate having a first input connected to said OR0 input, a second input connected to said OR1 input and an output connected to said ORout output, a second OR gate having a first input connected to said OR0 input, a second input connected to said ST1 input and an output, a first pass gate having an input connected to said output of said second OR gate, an output connected to said STout output, and a control gate connected to said control bit input, an invertor having a input connected to said control bit input and an output, and a second pass gate having an input connected to said ST0 input, an output connected to said STout output, and a control gate connected to said output of said invertor;

a first layer of said controllable OR gate cells having said OR0 and ST0 inputs connected a corresponding bit of said data port and said OR1 and ST1 input connected to a next higher bit of said data input port, said control bit input of each controllable OR gate cell of said first layer connected to a least significant bit of said control word input port;

subsequent layers of said controllable OR gate cells having said OR0 input connected to said ORout output of a first controllable OR gate cell of a prior layer, said ST0 input connected to said STout output of said first controllable OR gate cell of said prior layer, said OR1 input connected to said ORout output of a second controllable OR gate cell of said prior layer, said ST1 input connected to said STout output of said second controllable OR gate cell of said prior layer, said control bit inputs of each controllable OR gate cell of each layer connected to a corresponding bit of said control word input port; and said STout of a single controllable OR gate cell of a final layer forming said controllable width OR gate output.

2. An N bit wide controllable width OR gate comprising:

an N bit wide data input port;

a control word input port receiving a control word of M bits, where M equals $\log_2 N$ rounded up to the nearest integer number of bits;

N-1 controllable OR gate cells, each controllable OR gate cell having an OR0 input, a ST0 input, an OR1 input, a ST1 input, a control bit input, an ORout output and a STout output, each controllable OR gate cell performing the having following logic functions ORout=OR0 OR OR1

STout=[(ST1 OR OR0) AND C] OR [ST0 AND NOT(C)]

where: OR0 is the signal at said OR0 input, ST0 is the signal at said ST0 input, OR1 is the signal at said OR1 input, ST1 is the signal at said ST1 input, ORout is the signal generated at said ORout output, and STout is the signal generated at said Stout output, and C is said control bit input;

a first layer of said controllable OR gate cells having said OR0 and ST0 inputs connected a corresponding bit of said data port and said OR1 and ST1 input connected to a next higher bit of said data input port, said control bit input of each controllable OR gate cell of said first layer connected to a least significant bit of said control word input port;

subsequent layers of said controllable OR gate cells having said OR0 input connected to said ORout output of a first controllable OR gate cell of a prior layer, said ST0 input connected to said STout output of said first controllable OR gate cell of said prior layer, said OR1 input connected to said ORout output of a second controllable OR gate cell of said prior layer, said ST1 input connected to said STout output of said second controllable OR gate cell of said prior layer, said control bit inputs of each controllable OR gate cell of each layer connected to a corresponding bit of said control word input port; and said STout of a single controllable OR gate cell of a final layer forming said controllable width OR gate output.

3. A method of forming controllable width logical OR of input data on an N bit data bus corresponding to one more than a binary control word input comprising the steps of:

a) for each pair of bits of said input data
      forming an OR output as a logical OR of a first input bit and a second input bit of said pair of bits,
      forming a ST output as a logical OR of said first input bit and said second input bit of said pair of bits if a least significant bit of said binary control word is "1" and as said first input bit if said least significant bit of said binary control word is "0";

b) for each pair of prior OR outputs and ST outputs forming a next OR output as a logical OR of a first prior OR output and a second prior OR output of said pair of prior OR outputs and ST outputs, forming a next ST output as a logical OR of said first prior OR output and a second prior ST output of said pair of prior OR outputs and ST outputs if a corresponding bit of said binary control word is "1" and as a first prior ST output if said least significant bit of said binary control word is "0";

c) said next OR output forming a prior OR output and said next ST output forming a prior ST output for a subsequent formation of a next OR output and a next ST output; and d) said ST output of a last formation of a next OR output and a next ST output being the desired controllable width OR gate output.

* * * * *